United States Patent
Kanematsu et al.

(10) Patent No.: US 11,946,172 B2
(45) Date of Patent: Apr. 2, 2024

(54) ANTIBACTERIAL TWISTED YARN, AND ANTIBACTERIAL YARN AND ANTIBACTERIAL CLOTH INCLUDING ANTIBACTERIAL TWISTED YARNS

(71) Applicant: Murata Manufacturing Co., Ltd., Nagaokakyo (JP)

(72) Inventors: Shunsuke Kanematsu, Nagaokakyo (JP); Masayuki Tsuji, Nagaokakyo (JP); Kenichiro Takumi, Nagaokakyo (JP); Masamichi Ando, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 854 days.

(21) Appl. No.: 16/987,519

(22) Filed: Aug. 7, 2020

(65) Prior Publication Data
US 2020/0362485 A1 Nov. 19, 2020

Related U.S. Application Data

(63) Continuation of application No. PCT/JP2019/046128, filed on Nov. 26, 2019.

(30) Foreign Application Priority Data

Nov. 26, 2018 (JP) .................................. 2018-219964
Nov. 25, 2019 (JP) .................................. 2019-211997

(51) Int. Cl.
*D02G 3/44* (2006.01)
*D02G 3/04* (2006.01)
*H10N 30/30* (2023.01)
*H10N 30/857* (2023.01)

(52) U.S. Cl.
CPC ............... *D02G 3/449* (2013.01); *D02G 3/04* (2013.01); *H10N 30/30* (2023.02); *H10N 30/857* (2023.02); *D10B 2331/041* (2013.01)

(58) Field of Classification Search
CPC .... D02G 3/449; D02G 3/04; D10B 2331/041; B65D 77/00; B65D 85/808; B65B 9/213; B65B 9/2056; B65B 29/04
USPC ........................................................ 428/359
See application file for complete search history.

(56) References Cited

U.S. PATENT DOCUMENTS

2018/0355525 A1* 12/2018 Ando ................... H10N 30/857
2019/0078239 A1 3/2019 Ando et al.

FOREIGN PATENT DOCUMENTS

| JP | 2000239969 A | 9/2000 |
| JP | 2000303283 A | 10/2000 |
| JP | 2001346463 A | 12/2001 |
| JP | 2003247143 A | 9/2003 |

(Continued)

OTHER PUBLICATIONS

International Search Report Issued for PCT/JP2019/046128, dated Feb. 4, 2020.

(Continued)

*Primary Examiner* — Camie S Thompson
(74) *Attorney, Agent, or Firm* — ArentFox Schiff LLP

(57) ABSTRACT

An antibacterial twisted yarn including a first fiber and a second fiber having a shorter length than the first fiber and twisted together with the first fiber, wherein at least one of the first fiber and the second fiber includes a piezoelectric fiber that generates a charge by application of external energy.

17 Claims, 6 Drawing Sheets

(56) References Cited

FOREIGN PATENT DOCUMENTS

| JP | 2006129741 A | | 5/2006 | |
|----|--------------|---|--------|---|
| JP | 2011174190 | * | 9/2011 | ............ D03D 11/00 |
| JP | 2016209148 A | | 12/2016 | |
| JP | 2018090950 A | | 6/2018 | |
| WO | WO-2010146716 A1 | * | 12/2010 | ............ B65B 29/04 |
| WO | 2017212836 A1 | | 12/2017 | |

OTHER PUBLICATIONS

Written Opinion of the International Searching Authority issued for PCT/JP2019/046128 dated Feb. 4, 2020.
Takaki, Koichi; "Agricultural and Food Processing Applications of High-Voltage and Plasma Technologies"; J. HTSJ, vol. 51, No. 216, Jul. 2012, pp. 64-69. (Translation of Section 5 p. 67 "Freshness retention and component extraction by high voltage").
Microorganism Control—Science and Engineering published by Kodansha Ltd, Copyright T. Tsuchido, H. Kourai, H. Matsuoka, J. Koizumi, 2002; "Electrical Control" Section 4.1.3, p. 50. (Translation of section 4.1.3, p. 50).

* cited by examiner

FIG. 1(A)
FIG. 1(C)
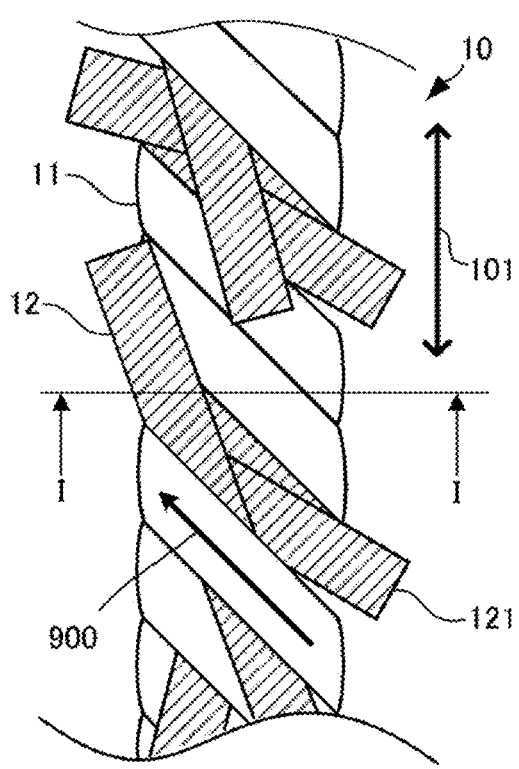
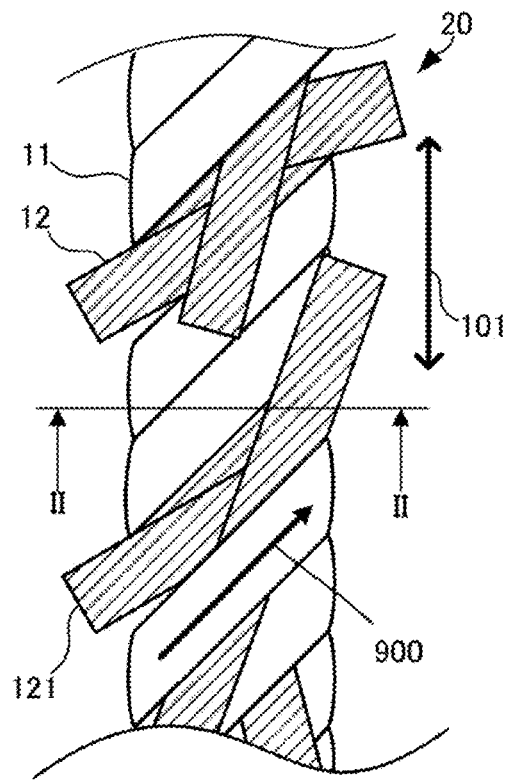
FIG. 1(B)
FIG. 1(D)
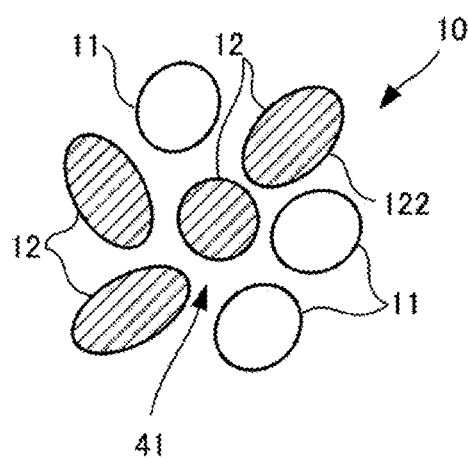
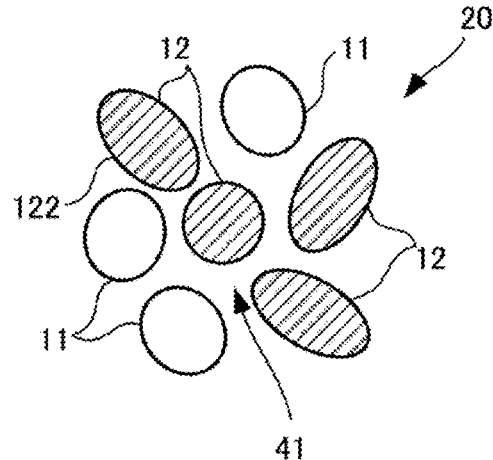

ANTIBACTERIAL TWISTED YARN, AND ANTIBACTERIAL YARN AND ANTIBACTERIAL CLOTH INCLUDING ANTIBACTERIAL TWISTED YARNS

CROSS REFERENCE TO RELATED APPLICATIONS

The present application is a continuation of International application No. PCT/JP2019/046128, filed Nov. 26, 2019, which claims priority to Japanese Patent Application No. 2018-219964, filed Nov. 26, 2018, and Japanese Patent Application No. 2019-211997, filed Nov. 25, 2019, the entire contents of each of which are incorporated herein by reference.

FIELD OF THE INVENTION

The present invention relates to an antibacterial twisted yarn having antibacterial properties and to an antibacterial yarn and an antibacterial cloth including antibacterial twisted yarns.

BACKGROUND OF THE INVENTION

Patent Document 1 discloses a yarn having antibacterial properties. The yarn disclosed in Patent Document 1 includes a charge-generating fiber that generates a charge by application of external energy. The yarn disclosed in Patent Document 1 includes a plurality of charge-generating fibers generating charges with different polarities and thus generates a charge between the charge-generating fibers to exhibit an antibacterial effect.

Patent Document 1: Japanese Patent Application Laid-Open No. 2018-090950

SUMMARY OF THE INVENTION

Firmly twisted fibers have small voids between the fibers. The fibers having smaller voids between the fibers are more unlikely to cause a charge generated between the fibers to leak to the outside of the yarn.

In order to solve this problem, an object of the present invention is to provide an antibacterial twisted yarn having a higher antibacterial effect than the antibacterial effect of other yarns having antibacterial properties, and to provide an antibacterial yarn and an antibacterial cloth including antibacterial twisted yarns.

An antibacterial twisted yarn of the present invention includes a first fiber and a second fiber having a shorter length than the first fiber and twisted together with the first fiber, wherein at least one of the first fiber and the second fiber includes a piezoelectric fiber that generates a charge by application of external energy.

Conventionally, it has been known that the proliferation of germs, fungi, and the like can be suppressed by an electric field (see, for example, Tetsuaki Tsuchido, Hiroki Kourai, Hideaki Matsuoka, and Junichi Koizumi "Microbial Control-Science and Engineering": Kodansha; and see for example, Koichi Takaki "Agricultural and Food Processing Applications of High-Voltage and Plasma Technologies," J. HTSJ, Vol. 51, No. 216). A potential difference generating the electric field sometimes causes an electric current to flow in a current path formed due to humidity or the like or in a circuit formed through a local micro-discharge phenomenon or the like. The electric current is considered to weaken bacteria and thus suppress the proliferation of bacteria.

The antibacterial twisted yarn according to the present invention that includes piezoelectric fibers generating a charge by application of external energy generates an electric field between the fibers or when brought close to an object, such as a human body, having a prescribed potential (including a ground potential). Alternatively, the antibacterial twisted yarn according to the present invention causes an electric current to flow via moisture such as sweat between the fibers or when brought close to an object, such as a human body, having a prescribed potential (including a ground potential).

Therefore, the antibacterial twisted yarn according to the present invention exhibits an antibacterial effect due to the following reasons. Due to a direct action of the electric field or the electric current generated in application of the antibacterial twisted yarn to articles (clothing, footwear, or medical supplies such as a mask) that are, for use, brought close to an object, such as a human body, having a prescribed potential, the antibacterial twisted yarn brings about a disorder to cell membranes of bacteria or a vital electron transfer system of bacteria to kill the bacteria or weaken the bacteria themselves. Further, the electric field or the electric current sometimes changes oxygen contained in moisture to active oxygen species. Alternatively, a stress environment in the presence of the electric field or the electric current sometimes produces oxygen radicals in cells of bacteria. An action of the active oxygen species including the radicals kills or weakens bacteria. Further, the above-described reasons are sometimes combined to generate the antibacterial effect. The term "antibacterial" referred to in the present invention is a concept including both the effect of suppressing the generation of bacteria and the effect of killing bacteria.

The piezoelectric fiber generating a charge by application of external energy is considered to include, for example, a substance having a photoelectric effect, a substance having a pyroelectric effect, or a fiber containing a piezoelectric body or the like. Alternatively, usable as the piezoelectric fiber is one that is formed by winding a conductive material-containing piezoelectric fiber with an insulating material and is thus configured to generate a charge by application of a voltage to the conductive material.

Use of the piezoelectric body that generates an electric field for its piezoelectricity requires no power source eliminating fear of an electrical shock. Further, the life of the piezoelectric body lasts longer than the antibacterial effect of drugs or the like. Further, the possibility of causing an allergic reaction by the piezoelectric body is lower than the possibility by the drugs.

The antibacterial twisted yarn according to the present invention includes long fibers (first fibers) and short fibers (second fibers). Twisting the long fibers and the short fibers together allows easy twists of the long fibers along a prescribed direction. The twisting allows easy twists of the short fibers along random directions with respect to the long fibers. The antibacterial twisted yarn includes the long fibers and the short fibers all of which are not twisted along a prescribed direction, to easily generate voids between the long fibers, between the short fibers, or between the long fibers and the short fibers. The antibacterial twisted yarn having many voids among the fibers allows the electric field generated by the piezoelectric fibers to easily leak to the outside of the antibacterial twisted yarn. This phenomenon allows the antibacterial twisted yarn according to the present invention to improve the antibacterial effect.

The invention is capable of attaining an antibacterial twisted yarn having a higher antibacterial effect than the antibacterial effect of other yarns having antibacterial properties, and attaining an antibacterial yarn and an antibacterial cloth including antibacterial twisted yarns.

BRIEF EXPLANATION OF THE DRAWINGS

FIG. 1(A) is a view illustrating a configuration of an antibacterial twisted yarn according to a first embodiment, and FIG. 1(B) is a sectional view along line I-I in FIG. 1(A). FIG. 1(C) is a view illustrating a configuration of an antibacterial twisted yarn according to the first embodiment, and FIG. 1(D) is a sectional view along line II-II in FIG. 1(C).

DETAILED DESCRIPTION OF THE INVENTION

Figure 2A:
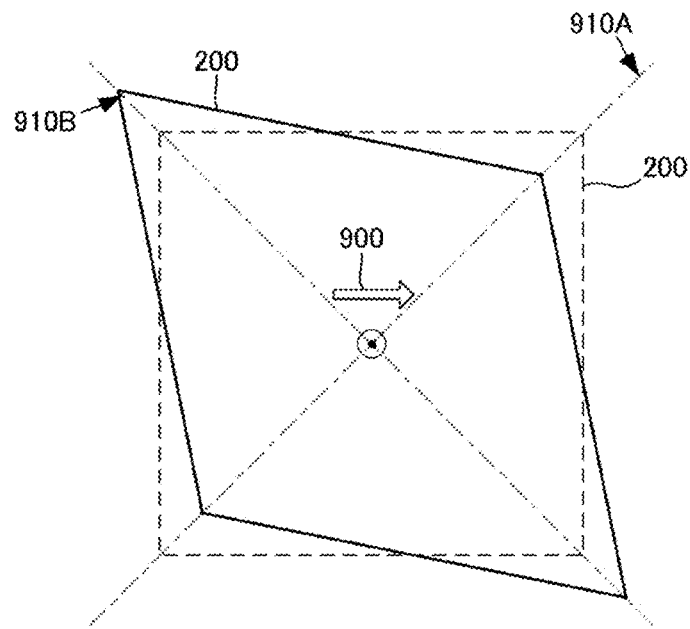
FIGS. 2(A) and 2(B) are views illustrating a relationship of a uniaxially stretching direction of a polylactic acid film, an electric field direction, and deformation of the polylactic acid film.

FIG. 1(A) is a view illustrating a configuration of an antibacterial twisted yarn 10 according to a first embodiment, and FIG. 1(B) is a sectional view along line I-I in FIG. 1(A). FIG. 1(C) is a view illustrating a configuration of an antibacterial twisted yarn 20 according to the first embodiment, and FIG. 1(D) is a sectional view along line II-II in FIG. 1(C). FIGS. 1(A) to 1(D) illustrate, as one example, sections of seven fibers in the section along line I-I or line II-II, the number of fibers constituting the antibacterial twisted yarn 10 is not limited to seven, but is actually appropriately set in view of the use or the like of the antibacterial twisted yarn 10. FIG. 1(B) illustrates only a cut surface along line I-I, and FIG. 1(D) illustrates only a cut surface along line II-II.

The antibacterial twisted yarns 10 and 20 each include long fibers 11 and short fibers 12. In this first embodiment, each of the long fibers 11 is a piezoelectric fiber generating a charge by application of external energy, for example, a stretch or a contraction. Each of the short fibers 12 is a normal fiber having no piezoelectric properties. The long fiber 11 may also be the normal fiber. When the long fiber 11 is the normal fiber, the short fiber 12 is the piezoelectric fiber.

The long fiber 11 is one example of the piezoelectric fiber (charge-generating fiber) generating a charge by a stretch or a contraction. The long fiber 11 is made of a functional polymer, for example, a piezoelectric polymer. Examples of the piezoelectric polymer include PVDF and polylactic acid (PLA). Polylactic acid (PLA) is a piezoelectric polymer that is not pyroelectric. Polylactic acid exerts piezoelectric properties when uniaxially stretched. As polylactic acid, there are PLLA obtained by polymerizing an L-form monomer; and PDLA obtained by polymerizing a D-form monomer. The long fiber 11 may further contain a material other than the functional polymer as long as the material does not inhibit the function of the functional polymer.

Polylactic acid is a chiral polymer and includes a main chain having a helical structure. Polylactic acid exerts piezoelectric properties due to molecular orientation brought by a uniaxial stretch of the polylactic acid. Further, polylactic acid increases its piezoelectric constant when subjected to a heat treatment to increase its crystallinity. The long fiber 11 made of uniaxially stretched polylactic acid has piezoelectric strain constants $d_{14}$ and $d_{25}$ as tensor components when a thickness direction is defined as a first axis, a stretching direction 900 is defined as a third axis, and a direction perpendicular to both the first axis and the third axis is defined as a second axis. Therefore, polylactic acid most efficiently generates a charge when strained in a direction at 45 degrees to the uniaxially stretching direction.

Figure 2B:
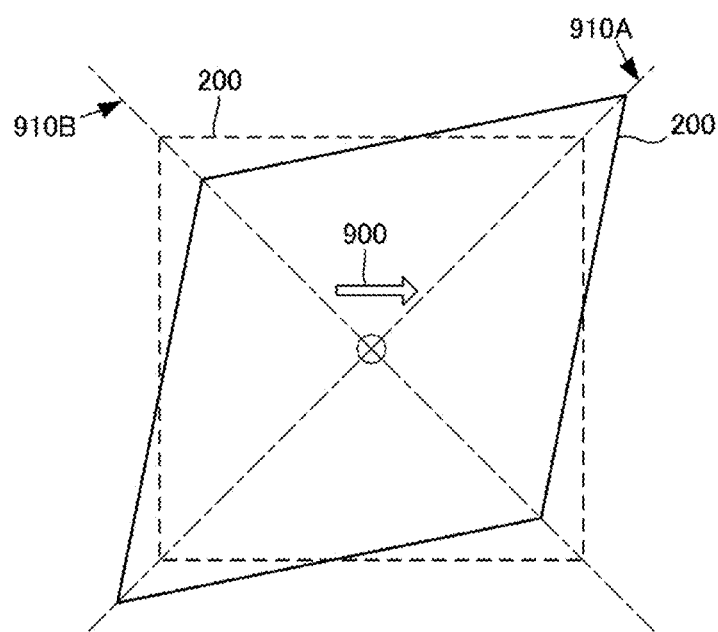

FIGS. 2(A) and 2(B) are views illustrating a relationship of a uniaxially stretching direction of a polylactic acid film 200, an electric field direction, and deformation of the polylactic acid film 200. FIGS. 2(A) and 2(B) illustrate model cases of the polylactic acid film 200 obtained by forming polylactic acid into a film shape. As illustrated in FIG. 2(A), when the polylactic acid film 200 is contracted in a direction along a first diagonal line 910A and stretched in a direction along a second diagonal line 910B perpendicular to the first diagonal line 910A, an electric field is generated in a direction from the back plane to the front plane of the paper. That is, the polylactic acid film 200 generates a negative charge on the front plane of the paper. As illustrated in FIG. 2(B), when stretched in the direction along the first diagonal line 910A and contracted in the direction along the second diagonal line 910B, the polylactic acid film 200 also generates a charge. The polarity of the charge, however, is reversed, and an electric field is generated in a direction from the front plane to the back plane of the paper. That is, the polylactic acid film 200 generates a positive charge on the front plane of the paper.

Polylactic acid that exerts piezoelectric properties due to a molecular orientation treatment by a stretch requires no poling treatment unlike other piezoelectric polymers such as PVDF, or piezoelectric ceramic. Uniaxially stretched polylactic acid has a piezoelectric constant of approximately 5 pC/N or more and 30 pC/N or less, which is very high among polymers. Further, the piezoelectric constant of polylactic acid does not vary over time and is very stable.

The long fiber 11 is preferably a fiber having a circular section. The long fiber 11 is produced, for example, by a technique of extrusion-molding a piezoelectric polymer into a fiber; a technique of melt-spinning a piezoelectric polymer into a fiber (including, for example, a spinning and drawing method in which a spinning step and a drawing step are performed separately from each other, a direct drawing method in which a spinning step and a drawing step are linked to each other, a POY-DTY method in which a false twisting step can also be performed simultaneously, or a super high speed spinning method in which spinning is accelerated); a technique of dry- or wet-spinning a piezoelectric polymer into a fiber (including, for example, a phase-separating method or a dry-wet-spinning method of dissolving a raw material polymer in a solvent and extruding the solution through a nozzle into a fiber, a gel spinning method of making a polymer into a gel uniform fiber containing a solvent, or a liquid crystal spinning method of making a liquid crystal solution or a melted liquid crystal into a fiber); or a technique of spinning a piezoelectric polymer electrostatically into a fiber. The sectional shape of the long fiber 11 is not limited to a circle. For example, the sectional shape of the long fiber 11 may be any one of a modified section, a hollow shape, a side-by-side shape, and a plurality of layers including two or more layers, or may be a combined shape of these shapes. The long fiber 11 preferably has a single fiber fineness of 0.3 dtex to 10 dtex.

The short fiber 12 is preferably, and similar to the long fiber 11, a fiber having a circular section. The short fiber 12 has a fiber length of preferably 800 mm or less, more preferably 500 mm or less, further preferably 100 mm or less.

The short fiber 12 preferably has a single fiber fineness of 0.3 dtex to 10 dtex.

The sectional shape of the short fiber 12 is not particularly limited. For example, the sectional shape of the short fiber 12 may be any one of a round section, a modified section, a hollow shape, a side-by-side shape, and a plurality of layers including two or more layers, or may be a combined shape of these shapes.

The short fiber 12 preferably has 0 crimps/inch to 20 crimps/inch, and preferably has a crimp size (percentage of crimp) of 0% to 20%.

The short fiber 12 satisfying these conditions is easily exteriorly exposed from a side surface of the antibacterial twisted yarn 10 or 20 as described in detail below.

As noted above, the short fiber 12 is preferably a normal fiber. The normal fiber is a fiber having no piezoelectric properties. Examples of the normal fiber include natural fibers such as cotton and hemp; chemical fibers such as polyester and polyurethane; recycled fibers such as rayon and cupro; semisynthetic fibers such as acetate; and twisted yarns formed by twisting these fibers. The strength and the degree of the stretch or the contraction of the short fiber 12 can be adjusted according to the state of use of the short fiber 12 by selection of a material for the short fiber 12.

The antibacterial twisted yarns 10 and 20 each constitute a yarn (multifilament yarn) formed by twisting a plurality of long fibers 11 made of PLLA and short fibers 12 having no piezoelectric properties. The antibacterial twisted yarn 10 is a right-twisted yarn (hereinafter, referred to as an S yarn) formed by right-twisting the long fibers 11 and the short fibers 12. The antibacterial twisted yarn 20 is a left-twisted yarn (hereinafter, referred to as a Z yarn) formed by left-twisting the long fibers 11 and the short fibers 12. The long fibers 11 are easily twisted along a prescribed direction. Therefore, all the long fibers 11 included in the antibacterial twisted yarns 10 and 20 are twisted along an identical direction.

The stretching direction 900 of each of the long fibers 11 coincides with the axial direction of each of the long fibers 11. In the antibacterial twisted yarn 10, the stretching direction 900 of the long fibers 11 is inclined to the left with respect to an axial direction 101 of the antibacterial twisted yarn 10. In the antibacterial twisted yarn 20, the stretching direction 900 of the long fibers 11 is inclined to the right with respect to an axial direction 101 of the antibacterial twisted yarn 20. The inclination angle of the stretching direction 900 to the axial direction 101 of the antibacterial twisted yarn 10 or 20 depends on the number of twists of the antibacterial twisted yarn 10 or 20. As the number of twists of the antibacterial twisted yarn 10 or 20 is increased, the inclination angle of the stretching direction 900 to the axial direction 101 of the antibacterial twisted yarn 10 or 20 increases accordingly. Therefore, adjustment of the number of twists of the antibacterial twisted yarn 10 or 20 enables the inclination angle of the long fibers 11 to the axial direction 101 of the antibacterial twisted yarn 10 or 20 to be adjusted.

In the antibacterial twisted yarn 10, the long fibers 11 are inclined at an inclination angle of 45 degrees to the left with respect to the axial direction 101 of the antibacterial twisted yarn 10. In the antibacterial twisted yarn 20, the long fibers 11 are inclined at an inclination angle of 45 degrees to the right with respect to the axial direction 101 of the antibacterial twisted yarn 20. That is, the stretching direction 900 of the long fibers 11 is inclined at 45 degrees to the left with respect to the axial direction 101 of the antibacterial twisted yarn 10, and is inclined at 45 degrees to the right with respect to the axial direction 101 of the antibacterial twisted yarn 20. The inclination angle of the long fibers 11 is not limited to 45 degrees. For example, the inclination angle of the long fibers 11 only needs to be 10 degrees or more and only needs to be in a range of not more than 55 degrees with respect to the axial direction 101 of the antibacterial twisted yarn 10. The antibacterial twisted yarn, however, is usually subjected to stresses from various directions, and therefore, the inclination angle of the long fibers 11 to the axial direction 101 of the antibacterial twisted yarn 10 is not limited to these angles as long as the long fibers 11 generate a charge even at an inclination angle in a range of less than 10 degrees and more than 55 degrees.

Figure 3A:
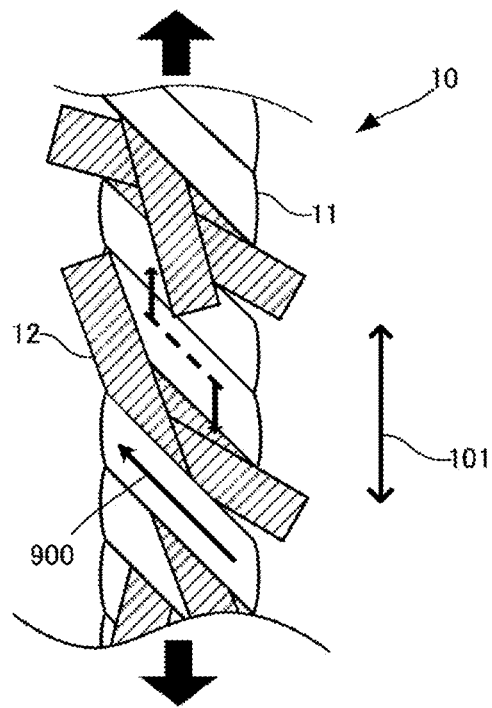
FIGS. 3(A) and 3(B) illustrate a shear stress (shearing stress) generated in each of piezoelectric fibers when tension is applied to the antibacterial twisted yarn.
Figure 3B:
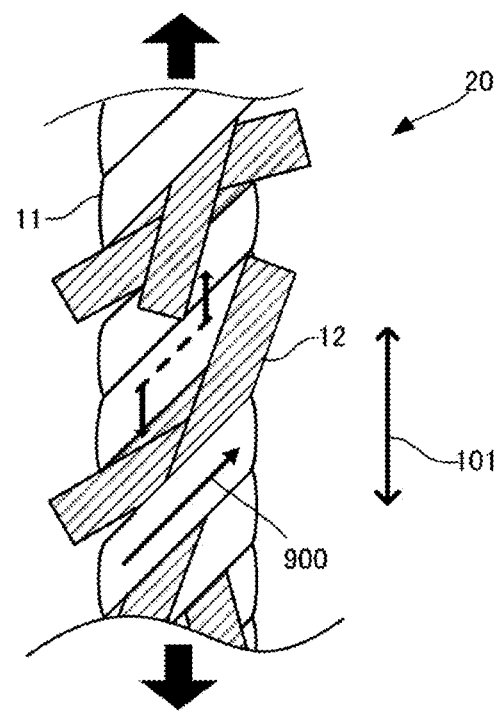

FIG. 3(A) illustrates a shear stress (shearing stress) generated in each of the long fibers 11 when tension is applied to the antibacterial twisted yarn 10. FIG. 3(B) illustrates a shear stress (shearing stress) generated in each of the long fibers 11 when tension is applied to the antibacterial twisted yarn 20.

As illustrated in FIG. 3(A), the application of external force (tension) to the antibacterial twisted yarn 10 causes the long fibers 11 to be as illustrated in FIG. 2(A) and thus to generate a negative charge on surfaces of the long fibers 11. The antibacterial twisted yarn 10 to which external force is applied generates a negative charge on a surface and a positive charge inside the antibacterial twisted yarn 10. On the other hand, as illustrated in FIG. 3(B), the application of external force (tension) to the antibacterial twisted yarn 20 causes the long fibers 11 to be as illustrated in FIG. 2(B) and thus to generate a positive charge on surfaces of the long fibers 11. The antibacterial twisted yarn 20 to which external force is applied generates a positive charge on a surface and a negative charge inside the antibacterial twisted yarn 20.

The potentials generated on the surfaces of the antibacterial twisted yarns 10 and 20 tend to be the same potential at mutually close places on the surfaces. In response to this phenomenon, the potential inside each of the yarns changes so as to keep the potential difference between the surface and the inside of the yarn. Therefore, the antibacterial twisted yarn 10 or 20 generates an electric field due to the potential difference generated by these charges. In each of the yarns, the electric field formed between the inside and the surface of the yarn leaks in an air atmosphere, and the electric fields are combined with each other to form a strong electric field in close parts of the antibacterial twisted yarns 10 and 20. When brought in proximity to a close prescribed potential, for example, an object, such as a human body, having a prescribed potential (including a ground potential), the potential generated in the antibacterial twisted yarn 10 or 20 generates an electric field between the antibacterial twisted yarn 10 and the object.

Conventionally, it has been known that the proliferation of germs and fungi can be suppressed by an electric field (see, for example, Tetsuaki Tsuchido, Hiroki Kourai, Hideaki Matsuoka, and Junichi Koizumi "Microbial Control-Science and Engineering": Kodansha; and see for example, Koichi Takaki "Agricultural and Food Processing Applications of High-Voltage and Plasma Technologies," J. HTSJ, Vol. 51, No. 216). A potential generating the electric field sometimes causes an electric current to flow in a current path formed due to humidity or the like or in a circuit formed through a local micro-discharge phenomenon or the like. The electric current is considered to weaken bacteria and thus suppress the proliferation of bacteria. The bacteria referred to in the present embodiment includes germs, fungi, and microorganisms such as a mite and a flea.

Therefore, the antibacterial twisted yarn 10 directly exhibits the antibacterial effect by the electric field formed in the vicinity of the antibacterial twisted yarn 10 or the electric field generated when brought close to an object, such as a human body, having a prescribed potential. Alternatively, the antibacterial twisted yarn 10 causes an electric current to flow via moisture such as sweat when brought close to another close fiber or an object, such as a human body, having a prescribed potential. The antibacterial twisted yarn 10 also sometimes directly exhibits the antibacterial effect by the electric current. Alternatively, the antibacterial twisted yarn 10 sometimes indirectly exhibits the antibacterial effect by active oxygen species that are formed through variation of oxygen contained in moisture due to an action of an electric current or a voltage, by radical species generated through a mutual action of the oxygen with an additive contained in the fibers or through a catalytic action of the oxygen, or by other antibacterial chemical species (such as an amine derivative). Alternatively, a stress environment in the presence of the electric field or the electric current sometimes produces oxygen radicals in cells of bacteria. The production allows the antibacterial twisted yarn 10 to sometimes indirectly exhibit the antibacterial effect. The radical considered to be generated is a superoxide anion radical (active oxygen) or a hydroxy radical. The term "antibacterial" referred to in the present embodiment is a concept including both the effect of suppressing the generation of bacteria and the effect of killing bacteria. The antibacterial twisted yarn 20 also directly or indirectly exhibits the antibacterial effect similarly to the antibacterial twisted yarn 10. Hereinafter, the present embodiment only describes the antibacterial twisted yarn 10 because the antibacterial twisted yarn 20 is similar to the antibacterial twisted yarn 10.

The short fibers 12 are shorter than the long fibers 11, so that the short fibers 12 twisted together with the long fibers 11 are easily twisted along more random directions than the long fibers 11. That is, as illustrated in FIG. 1(A), the short fibers 12 form random angles relative to the axial direction 101.

A string-shaped object such as a fiber has the smallest sectional area when cut orthogonal to the axial direction of the object, and increases the sectional area with nearness of the cut surface to a parallel to the axial direction. In the section of the antibacterial twisted yarn 10 illustrated in FIG. 1(B), the sectional areas of the long fibers 11 are relatively uniform, whereas the sectional areas of the short fibers 12 vary. For example, the sectional area of a short fiber 122 is larger than the sectional areas of the long fibers 11. This is because the short fiber 122 forms an angle of 45 degrees or more relative to the axial direction 101.

In the antibacterial twisted yarn 10, all of the long fibers 11 and the short fibers 12 are not twisted along a prescribed direction. Therefore, a void 41 is easily generated between the long fibers 11, between the short fibers 12, or between the long fibers 11 and the short fibers 12. The antibacterial twisted yarn 10 having many voids 41 among the fibers allows the electric field generated by the long fibers 11 to easily leak to the outside of the antibacterial twisted yarn 10. This phenomenon allows the antibacterial twisted yarn 10 to improve the antibacterial effect. Regardless of the presence of moisture, the antibacterial twisted yarn 10 exerts the antibacterial effect in the voids 41 generated among the fibers of the antibacterial twisted yarn 10.

Figure 4:
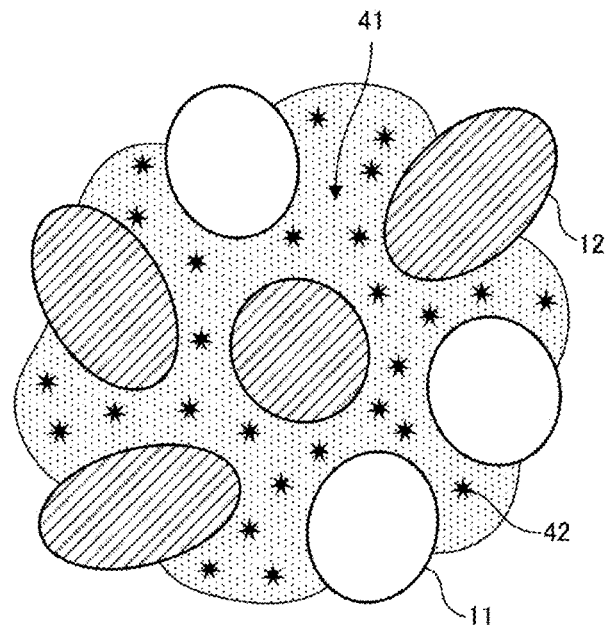
FIG. 4 is a sectional view schematically illustrating a part of an antibacterial twisted yarn for describing an antibacterial mechanism of the antibacterial twisted yarn.

FIG. 4 is a sectional view schematically illustrating a part of the antibacterial twisted yarn 10 for describing an antibacterial mechanism of the antibacterial twisted yarn 10. As illustrated in FIG. 4, the antibacterial twisted yarn 10 is capable of absorbing moisture around the antibacterial twisted yarn 10 in the void 41 between the long fibers 11 or the short fibers 12. A fine particle 42, such as a bacterium, absorbed in the antibacterial twisted yarn 10 together with moisture is easily retained in the antibacterial twisted yarn 10. Further, as the void 41 is larger in the antibacterial twisted yarn 10, the amount of moisture absorbed in the antibacterial twisted yarn 10 is increased accordingly, to also increase the amount of the fine particles 42 retained in the antibacterial twisted yarn 10. This makes the antibacterial twisted yarn 10 excellent in performance of collecting the fine particles 42. Further, the long fibers 11 provide a local and large electric field to the fine particles 42 retained and dispersed in the antibacterial twisted yarn 10. Therefore, the antibacterial twisted yarn 10 is capable of efficiently exerting the antibacterial effect for bacteria and the like attracted by the charge generated by the long fibers 11.

Because the antibacterial twisted yarn 10 includes the plurality of short fibers 12 that are shorter than the long fibers 11, the short fibers 12 are present only partially along the axial direction of the antibacterial twisted yarn 10. In the antibacterial twisted yarn 10, the short fibers 12 are in many cases discontinuous along the axial direction of the antibacterial twisted yarn 10. Ends (for example, tips 121 illustrated in FIGS. 1(A) and 1(B)) of the short fibers 12 are exposed from a side surface of the antibacterial twisted yarn 10 to the surroundings. Many ends of the short fibers 12 that are exposed to the side surface of the antibacterial twisted yarn 10 make the side surface of the antibacterial twisted yarn 10 have a so-called scuffing structure. This structure enables the antibacterial twisted yarn 10 to have variation of texture or appearance. The antibacterial twisted yarn 10 increases its surface area due to the scuffing to easily attract moisture or fine particles to the side surface of the antibacterial twisted yarn 10. These properties of the antibacterial twisted yarn 10 make the antibacterial twisted yarn 10 excellent in performance of collecting fine particles and capable of efficiently exerting the antibacterial effect for bacteria and the like attracted by the charge generated by the long fibers 11.

The material of the normal fiber for the short fiber 12 is preferably a material having a higher hydrophilicity than the hydrophilicity of the piezoelectric material of the long fiber 11. That is, the short fiber 12 is made of a material having a higher hydrophilicity than the hydrophilicity of PLLA. Therefore, the antibacterial twisted yarns 10 and 20 have a higher hydrophilicity than the hydrophilicity of a fiber only made of PLLA. The antibacterial twisted yarn 10 having a higher hydrophilicity allows moisture to more easily soak into the antibacterial twisted yarn 10. Therefore, the antibacterial twisted yarn 10 exhibits a higher collecting performance to more easily attract moisture or fine particles to the side surface or into the voids 41 of the antibacterial twisted yarn 10.

The antibacterial twisted yarn 10 having a higher hydrophilicity allows moisture to more easily spread out in the antibacterial twisted yarn 10. The moisture that has widely spread out in the antibacterial twisted yarn 10 increases its surface area to be easily vaporized. Generally, a hydrophilic fiber aggregate is known to have high drying properties. Infiltration of water into the voids 41 of the antibacterial twisted yarn 10 swells the antibacterial twisted yarn 10. Adversely, when water is vaporized to be discharged from the voids 41 to the outside of the antibacterial twisted yarn 10, the antibacterial twisted yarn 10 is contracted. The swelling or the contraction of the antibacterial twisted yarn 10 stretches or contracts the long fibers 11 in the antibacterial twisted yarn 10. The stretch or the contraction of the long fibers 11 generates a local high electric field space in the antibacterial twisted yarn 10. Bacteria taken in the antibacterial twisted yarn 10 are killed or inactivated in the high electric field space. Therefore, the antibacterial twisted yarn 10 is excellent in performance of collecting fine particles and is capable of efficiently exerting the antibacterial effect for bacteria and the like attracted by the charge generated by the long fibers 11.

The widths of the long fiber 11 and the short fiber 12 may be identical or different from each other. The widths of the long fibers 11 do not necessarily have to be uniform, and the widths of the short fibers 12 do not necessarily have to be uniform either.

As the yarn generating a negative charge on a surface of the yarn, a Z yarn containing PDLA is also considered to be used in addition to the S yarn containing PLLA. Further, as the yarn generating a positive charge on a surface of the yarn, an S yarn containing PDLA is also considered to be used in addition to the Z yarn containing PLLA.

Figure 5:
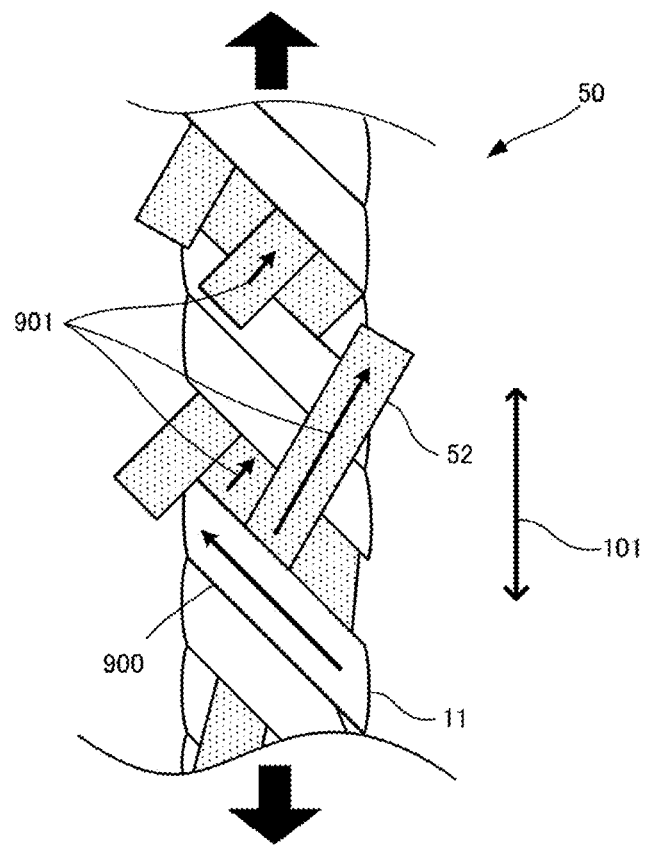
FIG. 5 is a view illustrating a configuration of an antibacterial twisted yarn according to a second embodiment.

Hereinafter, an antibacterial twisted yarn 50 according to a second embodiment is described. FIG. 5 is a view illustrating a configuration of the antibacterial twisted yarn 50 according to the second embodiment. In the description of the antibacterial twisted yarn 50, only the points different from the details in the first embodiment are described, and the points similar to the details in the first embodiment are not described.

As illustrated in FIG. 5, the antibacterial twisted yarn 50 includes short fibers 52. Each of the short fibers 52 is a piezoelectric fiber generating a charge by a stretch or a contraction. In the antibacterial twisted yarn 50, the short fibers 52 are twisted along random directions with respect to the direction along which long fibers 11 are twisted.

A stretching direction 900 of the long fibers 11 is inclined to the right with respect to an axial direction 101 of the antibacterial twisted yarn 50. Whereas stretching directions 901 of the short fibers 52 are inclined to the left with respect to the axial direction 101 of the antibacterial twisted yarn 50. Therefore, the application of external force (tension) to the antibacterial twisted yarn 50 causes the long fibers 11 to be as illustrated in FIG. 2(A) and thus to generate a negative charge on surfaces of the long fibers 11. Whereas the application of external force (tension) to the antibacterial twisted yarn 50 causes the short fibers 52 to be as illustrated in FIG. 2(B) and thus to generate a positive charge on surface of the short fibers 52.

The antibacterial twisted yarn 50 generates a positive charge and a negative charge. Therefore, the antibacterial twisted yarn 50 is capable of generating a relatively strong electric field between the long fibers 11 and the short fibers 52. When the long fiber 11 and the short fiber 52 are brought close to each other, the electric fields of the long fiber 11 and the short fiber 52 leak in an air atmosphere and combined together, to form an electric field between the long fiber 11 and the short fiber 52. That is, the potential difference in each place is defined by the electric field formed through a mutual and complicated tangle of the fibers or by the circuit that is formed of a current path incidentally formed in the yarn due to moisture or the like.

Figure 6A:
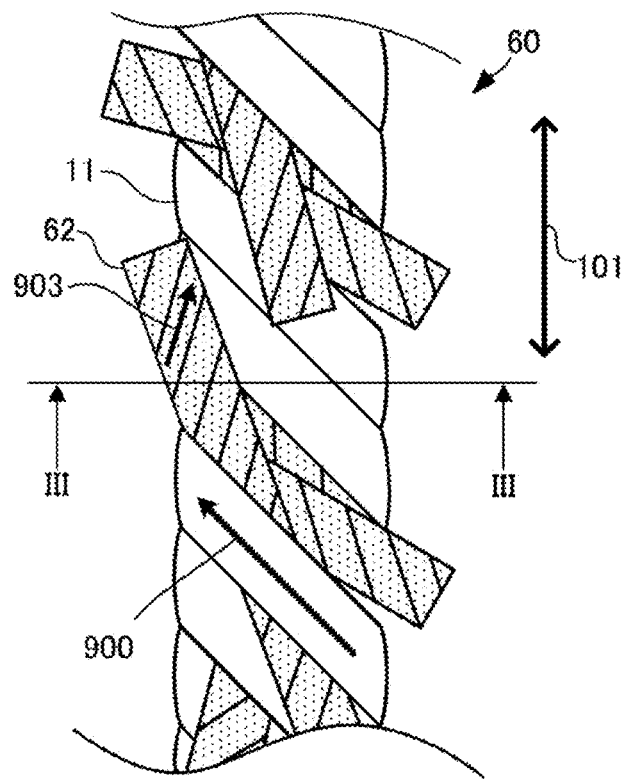
FIG. 6(A) is a view illustrating a configuration of an antibacterial twisted yarn according to a third embodiment.
Figure 6B:
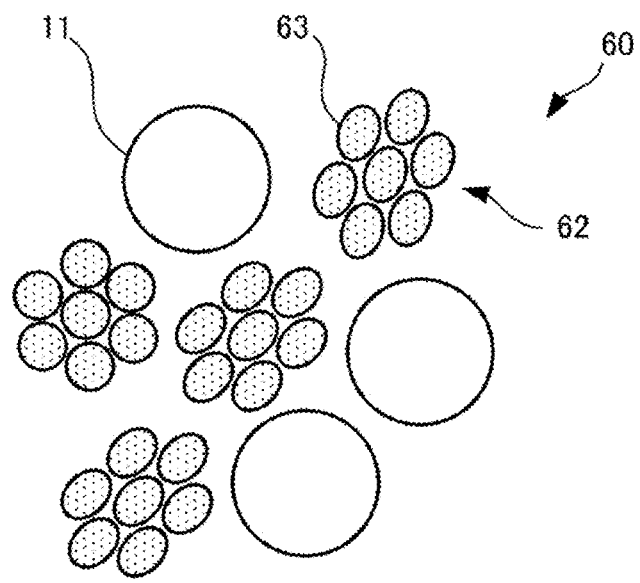
FIG. 6(B) is a sectional view along line III-III in FIG. 6(A).

Hereinafter, an antibacterial twisted yarn 60 according to a third embodiment is described. FIG. 6(A) is a view illustrating a configuration of the antibacterial twisted yarn 60 according to the third embodiment, and FIG. 6(B) is a sectional view along line III-III in FIG. 6(A). In the description of the antibacterial twisted yarn 60, only the points different from the details of the antibacterial twisted yarn 10 in the first embodiment are described, and the points similar to the details in the first embodiment are not described.

As illustrated in FIGS. 6(A) and 6(B), the antibacterial twisted yarn 60 includes short fibers 62. Each of the short fibers 62 is a twisted yarn made of a plurality of fibers 63 and is a left-twisted yarn formed by left-twisting the fibers 63. Each of the fibers 63 is a piezoelectric fiber generating a charge by a stretch or a contraction. A stretching direction 903 of the fibers 63 is inclined to the left with respect to the axial direction of the fibers 62. The fibers 62 are arranged in random directions relative to the axial direction of the antibacterial twisted yarn 60. Therefore, the stretching directions 903 of the fibers 63 are inclined to various directions with respect to the axial direction 101 of the antibacterial twisted yarn 60. Some of the fibers 63 are inclined to the right with respect to the axial direction 101 of the antibacterial twisted yarn 60 to generate a positive charge on surface of the fiber 62 when extended. Therefore, the antibacterial twisted yarn 60 is capable of generating a relatively strong electric field between long fibers 11 and the short fibers 62.

The short fiber 62 is not limited to the one formed by twisting a plurality of piezoelectric fibers together, but may be a covering yarn formed by winding a piezoelectric film around a core yarn or a space to be a core. This structure also enables a similar effect. This structure does not necessarily require the core yarn. Even without the core yarn, it is possible to make the piezoelectric film function as a piezoelectric fiber by helically twisting the piezoelectric film (twisted yarn). Without the core yarn, the twisted yarn is a hollow yarn to improve its heat retaining performance. Further, the strength of the twisted yarn can be increased by impregnating the twisted yarn itself with an adhesive agent. Further, as the long fiber 11, the covering yarn may be used that is formed by winding a piezoelectric film around a core yarn or a space to be a core.

Figure 7:
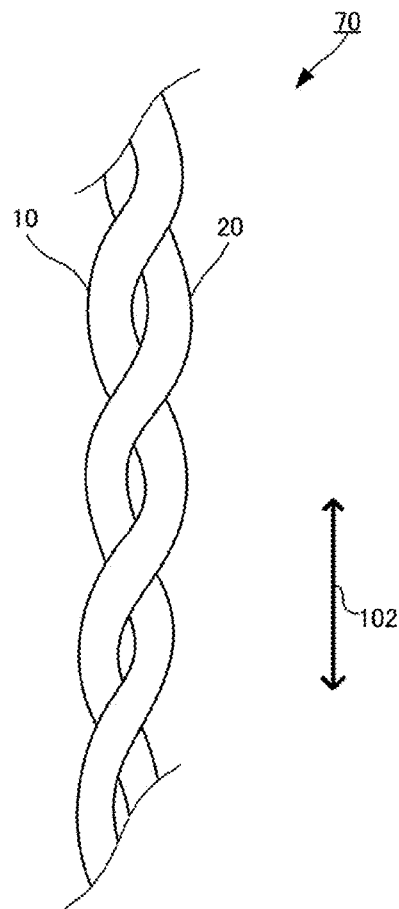
FIG. 7 is a partially exploded view illustrating a configuration of an antibacterial yarn.

Hereinafter, an antibacterial yarn 70 is described. FIG. 7 is a partially exploded view illustrating a configuration of the antibacterial yarn 70.

As illustrated in FIG. 7, the antibacterial yarn 70 includes both the antibacterial twisted yarns 10 and 20. The antibacterial yarn 70 is a yarn (Z yarn) formed by mutually left-twisting the antibacterial twisted yarns 10 and 20. In the antibacterial twisted yarns 10 and 20 of the first embodiment, the stretching direction 900 of the long fibers 11 is inclined at 45 degrees to the axial direction 101 of each of the antibacterial twisted yarns 10 and 20. The antibacterial yarn 70 is formed by further twisting the antibacterial twisted yarns 10 and 20. Adjustment of the number of twists of the antibacterial twisted yarns 10 and 20 and the antibacterial yarn 70 enables the stretching direction 900 of the long fibers 11 in each of the antibacterial twisted yarns 10 and 20 to be adjusted to be finally inclined at 45 degrees to an axial direction 102 of the antibacterial yarn 70.

The antibacterial twisted yarn 20 is a Z yarn containing PLLA, but may be an S yarn containing PDLA. The antibacterial twisted yarns 10 and 20 that are the same S yarn enable easy adjustment of the angle between the yarns in production of the antibacterial yarn 70.

The antibacterial yarn 70 is formed by intersection of the antibacterial twisted yarn 10 generating a negative charge on the surface with the antibacterial twisted yarn 20 generating a positive charge on the surface, so that the antibacterial yarn 70 is capable of singly generating an electric field. In each of the antibacterial twisted yarns 10 and 20, the electric field formed between the inside and the surface of the yarn leaks in an air atmosphere. The electric fields generated by the antibacterial twisted yarns 10 and 20 are combined with each other. A strong electric field is formed in close parts of the antibacterial twisted yarns 10 and 20. This phenomenon allows the antibacterial yarn 70 to exert the antibacterial effect.

The antibacterial twisted yarns 10 and 20 have complicated structures and thus are non-uniform in places of the antibacterial twisted yarns 10 and 20 that are close to each other. Further, the application of tension to the antibacterial twisted yarn 10 or 20 changes the distance therebetween at the close places. This change gives each part a change in strength of the electric field to generate an electric field whose symmetry is broken. A yarn (S yarn) formed by mutually right-twisting the antibacterial twisted yarns 10 and 20 is also similarly capable of singly generating an electric field. The number of twists of the antibacterial twisted yarn 10, the number of twists of the antibacterial twisted yarn 20, or the number of twists of the antibacterial yarn 70 formed by twisting the antibacterial twisted yarns 10 and 20 together are decided in view of the antibacterial effect desired.

Figure 8:
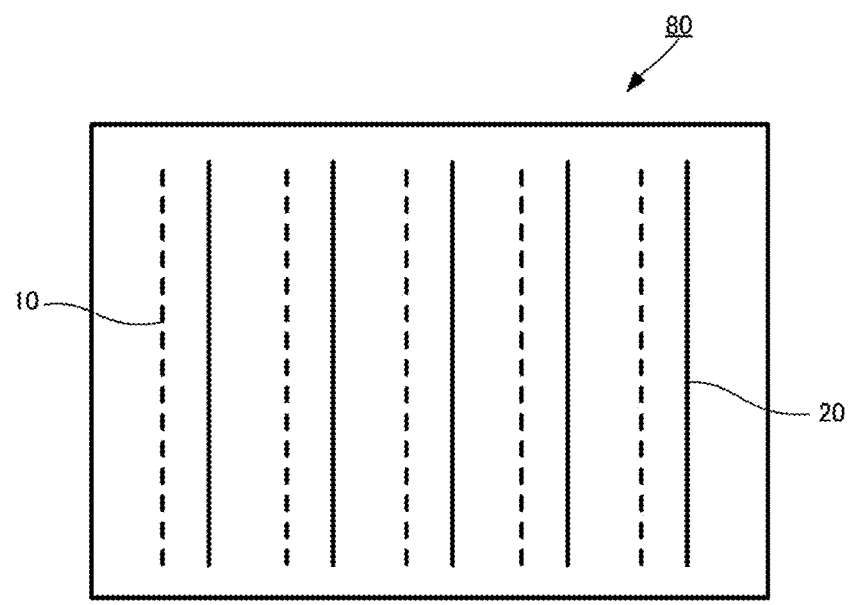
FIG. 8 is a view illustrating a configuration of an antibacterial cloth.

Hereinafter, an antibacterial cloth 80 is described. FIG. 8 is a view illustrating a configuration of the antibacterial cloth 80.

As illustrated in FIG. 8, the antibacterial cloth 80 includes a plurality of antibacterial twisted yarns 10 and a plurality of antibacterial twisted yarns 20. A part of the antibacterial cloth 80 other than the antibacterial twisted yarns 10 and 20 are non-piezoelectric fibers. Here, the non-piezoelectric fibers include those made of, for example, a natural fiber (cotton, wool, or the like) or a synthetic fiber generally used as a yarn and that generates no charge. The non-piezoelectric fibers may include a material that generates a charge weaker than the charge generated by the antibacterial twisted yarn 10 or 20. The antibacterial cloth 80 includes the antibacterial twisted yarns 10 and 20 alternately arranged in parallel, and has the antibacterial twisted yarns 10 and 20 and the non-piezoelectric fibers woven together therein.

The antibacterial cloth 80 preferably includes, as warp yarns, the antibacterial twisted yarns 10 and 20 and the non-piezoelectric fibers, and includes, as weft yarns, the non-piezoelectric fibers. The antibacterial cloth 80, however, does not necessarily have to include the non-piezoelectric fibers woven therein as the warp yarns, but may only include the antibacterial twisted yarns 10 and 20 as the warp yarns. The weft yarns are not limited to the non-piezoelectric fibers, but may include the antibacterial twisted yarns 10 or 20.

Extension of the antibacterial cloth 80 in a direction parallel to the warp yarns causes the antibacterial twisted yarns 10 and 20 to generate a charge. In each of the antibacterial twisted yarns 10 and 20, the electric field formed between the inside and the surface of the yarn leaks in an air atmosphere. The electric fields generated by the antibacterial twisted yarns 10 and 20 are combined with each other. A strong electric field is formed in close parts of the antibacterial twisted yarns 10 and 20. This phenomenon allows the antibacterial cloth 80 to exert the antibacterial effect.

The antibacterial cloth 80 is not limited to a woven cloth. Examples of the antibacterial cloth 80 include a knitted cloth including the antibacterial twisted yarns 10 and 20 as knitting yarns, and a nonwoven cloth including the antibacterial twisted yarns 10 and 20.

The antibacterial twisted yarns 10, 20, 50, or 60, the antibacterial yarn 70, or the antibacterial cloth 80 described above are applicable to various types of clothing or articles such as a medical member. For example, the antibacterial twisted yarns 10, 20, 50, or 60, the antibacterial yarn 70, or the antibacterial cloth 80 is applicable to masks, underwear (particularly socks), towels, insoles of shoes, boots, and the like, general sportswear, hats, bedding (including comforters, mattresses, sheets, pillows, pillowcases, and the like), toothbrushes, dental floss, filters and the like of water purifiers, air conditioners, or air purifiers, stuffed toys, pet-related items (pet mats, pet clothes, inners for pet clothes), various types of mats (for feet, hands, toilet seat, or the like), curtains, kitchen utensils (sponges, dishcloths, or the like), seats (seats of cars, trains, airplanes, or the like), cushioning materials and exterior materials of motorcycle helmets, sofas, bandages, gauze, sutures, clothes for doctors and patients, supporters, sanitary goods, sporting goods (inners for wear and gloves, gauntlets for use in martial arts, or the like), filters of air conditioning units, air purifiers, or the like, packing materials, or window screens.

Finally, the description of the present embodiments is to be considered in all respects as illustrative and not restrictive. The scope of the present invention is indicated not by the above-described embodiments but by the claims. Further, it is intended that the scope of the present invention includes all variations within meanings and scopes equivalent to the claims.

DESCRIPTION OF REFERENCE SYMBOLS 10, 20, 50, 60: Antibacterial twisted yarn
11: Long fiber
12: Short fiber
70: Antibacterial yarn
80: Antibacterial cloth

The invention claimed is:

1. An antibacterial twisted yarn comprising:
a first fiber; and
a second fiber having a shorter length than the first fiber and twisted together with the first fiber,
wherein at least one of the first fiber and the second fiber includes a piezoelectric fiber that generates a charge by application of external energy, and the first fiber is twisted at a prescribed angle relative to an axial direction of the antibacterial twisted yarn and the second fiber is twisted at a random angle relative to the axial direction of the antibacterial twisted yarn.

2. The antibacterial twisted yarn according to claim 1, wherein
the first fiber is the piezoelectric fiber, and
the second fiber is a fiber having no piezoelectric properties.

3. The antibacterial twisted yarn according to 2, wherein the fiber having no piezoelectric properties contains a material having a higher hydrophilicity than that of the piezoelectric fiber.

4. The antibacterial twisted yarn according to claim 1, wherein both the first fiber and the second fiber are the piezoelectric fiber.

5. The antibacterial twisted yarn according to claim 4, wherein the second fiber is a twisted yarn made of a plurality of piezoelectric fibers.

6. The antibacterial twisted yarn according to claim 1, wherein the piezoelectric fiber contains a chiral polymer.

7. The antibacterial twisted yarn according to claim 6, wherein the chiral polymer is polylactic acid.

8. The antibacterial twisted yarn according to claim 1, wherein the first fiber has a circular section.

9. The antibacterial twisted yarn according to claim 8, wherein the second fiber has a circular section.

10. The antibacterial twisted yarn according to claim 1, wherein the second fiber has a fiber length of 800 mm or less.

11. The antibacterial twisted yarn according to claim 1, wherein the antibacterial twisted yarn is a right-twisted yarn.

12. The antibacterial twisted yarn according to claim 1, wherein the antibacterial twisted yarn is a left-twisted yarn.

13. An antibacterial yarn comprising:
a plurality of the antibacterial twisted yarns according to claim 1 twisted together,
wherein the plurality of the antibacterial twisted yarns include a first antibacterial twisted yarn and a second antibacterial twisted yarn, and
the first antibacterial twisted yarn and the second antibacterial twisted yarn are constructed to generate charges with different polarities from each other.

14. The antibacterial yarn according to claim 13, wherein the antibacterial yarn is a right-twisted yarn.

15. The antibacterial yarn according to claim 13, wherein the antibacterial yarn is a left-twisted yarn.

16. An antibacterial cloth comprising the antibacterial twisted yarn according to claim 1.

17. An antibacterial cloth comprising:
a plurality of the antibacterial twisted yarns according to claim 1,
wherein the plurality of the antibacterial twisted yarns include a first antibacterial twisted yarn and a second antibacterial twisted yarn,
the first antibacterial twisted yarn and the second antibacterial twisted yarn are constructed to generate charges with different polarities from each other, and
the first antibacterial twisted yarn and the second antibacterial twisted yarn are alternately arranged in parallel.

* * * * *